(12) United States Patent
Takenaka et al.

(10) Patent No.: US 9,276,179 B2  
(45) Date of Patent: Mar. 1, 2016

(54) LIGHT EMITTING DEVICE AND METHOD FOR PRODUCING SAME

(71) Applicant: Sharp Kabushiki Kaisha, Osaka (JP)

(72) Inventors: Yasuji Takenaka, Osaka (JP); Masashi Takemoto, Osaka (JP); Nobuaki Aoki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 62 days.

(21) Appl. No.: 13/958,653

(22) Filed: Aug. 5, 2013

(65) Prior Publication Data

US 2015/0034983 A1 Feb. 5, 2015

Related U.S. Application Data

(63) Continuation of application No. 13/001,355, filed as application No. PCT/JP2009/060332 on Jun. 5, 2009, now abandoned.

(30) Foreign Application Priority Data

Jun. 25, 2008 (JP) ................................. 2008-165897

(51) Int. Cl.
*H01L 33/52* (2010.01)
*H01L 33/44* (2010.01)
(Continued)

(52) U.S. Cl.
CPC .............. *H01L 33/52* (2013.01); *H01L 27/156* (2013.01); *H01L 33/44* (2013.01); *H01L 33/486* (2013.01); *H01L 33/502* (2013.01); *H01L 33/62* (2013.01); *H01L 33/56* (2013.01)

(58) Field of Classification Search
CPC ....... H01L 33/52; H01L 33/50; H01L 33/405; H01L 31/00; H01L 21/00; H01L 21/222; H01L 31/028; H01L 31/022425; H01L 31/1804; H01L 31/068; H01L 27/14636; Y02E 10/50
USPC ....................................................... 257/88, 98
See application file for complete search history.

(56) References Cited

U.S. PATENT DOCUMENTS

2006/0157722 A1* 7/2006 Takezawa et al. .............. 257/98
2008/0023713 A1 1/2008 Maeda et al.
(Continued)

FOREIGN PATENT DOCUMENTS

JP 2002-033517 1/2002
JP 2004/074885 9/2004
(Continued)

OTHER PUBLICATIONS

U.S. Appl. No. 13/001,355, filed Dec. 23, 2010; Takenaka et al.
(Continued)

*Primary Examiner* — Michelle Mandala
(74) *Attorney, Agent, or Firm* — Nixon & Vanderhye P.C.

(57) ABSTRACT

There is provided a light emitting device highly resistant to the environment, and having good heat resistance, light resistance and gas barrier property, and a method for producing same. With the light emitting device, a substrate 2 and interconnect patterns 5A, 5B formed on the surface thereof are covered with an acrylic resin primer 10 having better gas barrier property than a silicone resin sealing resin part 3. Light resistance is ensured by the silicone resin sealing resin portion 3 and the gas barrier property can be ensured by the acrylic resin primer 10.

1 Claim, 6 Drawing Sheets

(51) Int. Cl.
*H01L 27/15* (2006.01)
*H01L 33/48* (2010.01)
*H01L 33/50* (2010.01)
*H01L 33/62* (2010.01)
*H01L 33/56* (2010.01)

(56) References Cited

U.S. PATENT DOCUMENTS

2008/0031009 A1    2/2008  Kodaira et al.
2008/0237614 A1*  10/2008  Ishikura et al. ............. 257/89
2009/0141492 A1*   6/2009  Fujino .................... H01L 33/60
                                                          362/249.02

FOREIGN PATENT DOCUMENTS

| JP | 2004-339450 | 12/2004 |
| JP | 2005-136378 | 5/2005 |
| JP | 2006-519896 | 8/2006 |
| JP | 2007-036044 | 2/2007 |
| JP | 2007-227530 | 9/2007 |
| JP | 2007-294631 | 11/2007 |
| JP | 2008-010591 | 1/2008 |

OTHER PUBLICATIONS

International Search Report for PCT/JP2009/060332, mailed Jun. 30, 2009.

Dictionary.com, "cover," in Dictionary.com Unabridged. Source location: Random House, Inc. http://dictionary.reference.com/browse/cover. Available: http://dictionary.reference.com. Accessed: Mar. 28, 2013.

Office Action for U.S. Appl. No. 14/753,043 mailed Nov. 19, 2015; Takenaka.

* cited by examiner

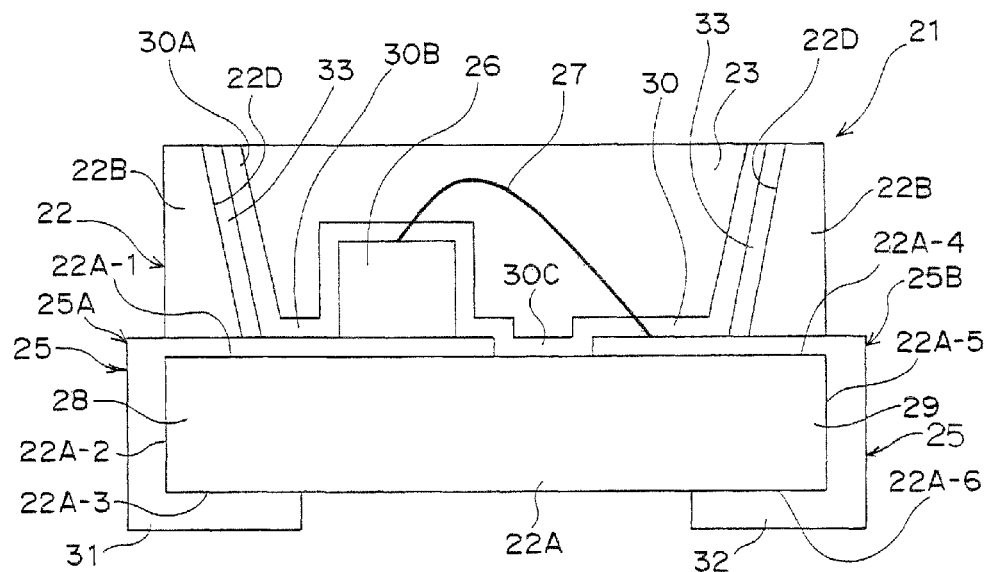
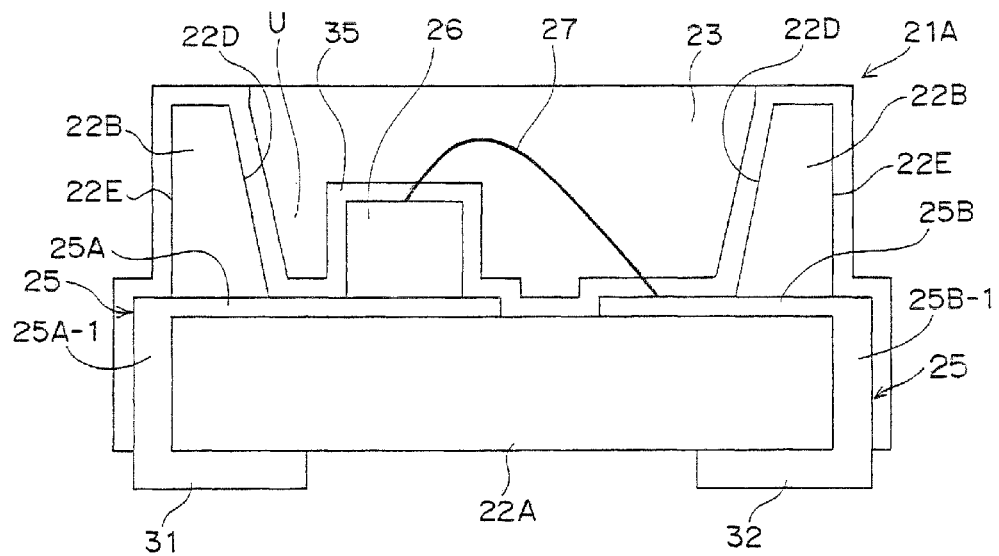

LIGHT EMITTING DEVICE AND METHOD FOR PRODUCING SAME

This application is a division of U.S. patent application Ser. No. 13/001,355 filed Dec, 23, 2010, which is the U.S. national phase of International Application No. PCT/JP 2009/060332 filed 5 Jun. 2009, which designated the U.S. and claims priority to Japanese Patent Application No. 2008-165897, filed 25 Jun. 2008, the entire contents of all of which are hereby all incorporated herein by reference.

TECHNICAL FIELD

The present invention relates to a light emitting device, as well as a method for producing the same, on which an LED (Light Emitting Diode) chip is mounted.

BACKGROUND ART

In 1990's, blue LEDs were developed and marketed, and white LEDs in combination with YAG (yttrium-aluminum-garnet) fluorophor that emits yellow light at high efficiency upon reception of light from the blue LED chip were also developed. In response to this, development directed toward stabler chromaticity of white color or higher brightness has been being advanced in view of applications and progresses for general lighting using LEDs and backlight light sources of LEDs for TV use. A large challenge in making such development is to improve the thermal resistance and light resistance of the sealing resin for sealing the LED chip.

White LEDs have a problem of deterioration of peripheral members due to blue light, which is emitted from the LED chip in use and which is short in wavelength and large in energy. When epoxy resin is used as the sealing resin, there occur such deteriorations as discoloring of the sealing resin due to the short wavelength and large energy of the emission of the LED chip, so that high-brightness light emission cannot be maintained for long time. As sealing resins that can meet the desire for that long-time high-brightness light emission, silicone-based resins have been being in use.

However, silicone-based resins, although excellent in light resistance, are poor at gas barrier property in not a few cases. Poor gas barrier property of the sealing resin causes occurrence of condensations at the interface between the sealing resin and the substrate or package due to permeation of steam as an example, leading to deteriorations or short-circuits of interconnect patterns or chip electrodes. Also, while sealing resins for vehicle use need to have corrosive-gas resistance, poor gas barrier property of the sealing resin causes occurrence of deteriorations or short-circuits of the interconnect patterns or chip electrodes, as in the case of condensations, making it impossible to satisfy the reliability.

Meanwhile, some silicone-based resins are denatured with resins of good gas barrier property, but those are lowered in light resistance. Under the current circumstances, it is quite difficult to find out an optimum sealing resin.

Besides, since silicone-based resins are so weak in adhesion that heat generation of the chip or the like causes resin peeling to occur at interfaces with peripheral members due to differences in coefficient of thermal expansion. This leads to characteristic deteriorations as a light emitting device such as degradation of light-emission brightness.

Thus, as it stands, even adopting silicone-based resins can hardly meet the desires for thermal resistance, light resistance and gas barrier property.

In this connection, Patent Literature 1 (JP 2004-339450 A) discloses an LED package for improving the light resistance of the sealing resin. This LED package, including an opening portion composed of a bottom face and a side wall, is integrally formed from formation resin so that the bottom face of the opening portion has end portions of a positive external electrode and a negative external electrode exposed with specified distances, respectively. It is also described that in this LED package, a primer layer is provided on the LED package surface before providing mold resin (sealing resin). Further, in this LED package, used as the primer layer are primer compositions characterized by including acrylic polymers, silanol condensation catalysts, silane coupling agent and/or epoxy group-containing compounds as an essential component in a solution. As a result of this, peeling after the light resistance test is suppressed, and the bonding reliability between the LED package and the sealing resin is improved.

In the prior art shown above, although improvement of the adhesion property during the thermal resistance test and the light resistance test by the primer layer is fulfilled, yet improvement of the gas barrier property is not disclosed.

CITATION LIST

Patent Literature

PATENT LITERATURE 1: JP 2004-339450 A

SUMMARY OF INVENTION

Technical Problem

Accordingly, an object of the present invention is to provide a light emitting device, as well as a method for producing the same, which is high in thermal resistance, light resistance and gas barrier property and high in environment resistance.

Solution to Problem

In order to achieve the above object, there is provided a light emitting device comprising:
a substrate;
a metal portion formed on a surface of the substrate;
an LED chip mounted on the substrate;
a primer made of resin which covers at least part of the metal portion; and
a sealing resin portion which covers the LED chip and at least part of the primer to seal the LED chip, wherein
the primer is made from a resin which is higher in gas barrier property than the sealing resin portion.

According to the light emitting device of this invention, since the primer made of a resin higher in gas barrier property than the sealing resin portion covers the metal portion formed on the surface of the substrate, the gas barrier property can be improved.

In an embodiment, the primer is formed into a layer shape.

According to the light emitting device of this embodiment, the gas barrier property can be improved securely with the layered primer.

In an embodiment, the primer is made from an acrylic resin.

According to the light emitting device of this embodiment, the gas barrier property can particularly be improved.

In an embodiment, the metal portion includes an interconnect pattern.

According to the light emitting device of this embodiment, the gas barrier property for the interconnect patterns formed on the substrate surface can be improved.

In an embodiment, the metal portion includes a lead frame.

According to the light emitting device of this embodiment, the gas barrier property for the lead frame can be improved.

In an embodiment, the metal portion includes a metal reflection coating.

According to the light emitting device of this embodiment, the gas barrier property for the metal reflection coating can be improved.

In an embodiment, a surface of the metal portion is made from Ag, or AgBi-based alloy, or AgNd-based alloy, or an Ag alloy containing 0.5 to 5.0 wt % of at least one kind of metal selected from Pt, Au, Cu, Pd, Mg, Ti and Ta.

According to the light emitting device of this embodiment, a particularly effective gas barrier property for the surface of the metal portion containing silver, which is indeed high in reflectivity but liable to blackening, can be provided with protection by the primer.

In an embodiment, the substrate is made from any one of a light-reflective resin, metal and ceramic.

According to the light emitting device of this embodiment, since light irradiated from the LED chip is reflected by the substrate, light emitted from the LED chip can be blocked from being attenuated.

In an embodiment, at least a top face of the LED chip is exposed from the primer made of resin.

According to the light emitting device of this embodiment, since the top face of the chip, which becomes higher in temperature, is exposed from the resin-made primer, influences of heat on the primer can be reduced.

In an embodiment, the LED chip has its top face and side face coated with the primer made of resin.

According to the light emitting device of this embodiment, the primer applying step becomes simple to achieve, allowing a spin coat process or other processes to be selected in addition to dispensing process, which gives an advantage for an easier achievement of cost reduction.

In an embodiment, the primer covers a top face of the substrate.

In an embodiment, the primer covers an entire surface of the substrate.

In an embodiment, the primer covers a top face of the substrate, and the LED chip is mounted on the primer covering the top face of the substrate.

According to the light emitting device of this embodiment, the light emitting device is suitable for cases in which electrodes are provided on the top face of the substrate. In this case, forming the primer before die bonding or wire bonding allows the primer application to be done by brush, roller or the like, so that the primer can be formed more simply. In addition, in cases where the primer is applied over the entire surface of the substrate, dipping process or the like can also be selected for the formation of the primer, allowing further cost reduction and higher throughput to be realized.

In an embodiment, the metal reflection coating is formed on the substrate,
the primer is formed on the metal reflection coating, and
the interconnect pattern is formed on the primer.

According to the light emitting device of this embodiment, a gas barrier for the metal reflection coating can be fulfilled by the primer.

In an embodiment, the primer has a thickness of 0.01 μm to 100 μm.

According to the light emitting device of this embodiment, gas barrier property of the primer can be ensured, and decreases of brightness due to optical losses caused by discoloration (yellowing) with heat or light can be reduced. It is noted that when the thickness of the primer is less than 0.01 μm, there can occur an abrupt increase in gas permeation amount due to coating irregularities or the like. Further, when the thickness of the primer is over 100 μm, there occurs decreases of the brightness due to optical losses caused by discoloration (yellowing) with heat or light.

In an embodiment, the sealing resin portion is in close contact with a surface of at least part of the primer.

In an embodiment, the LED chip is placed within a recess portion of the substrate,
the primer covers a bottom face of the recess portion of the substrate,
the sealing resin portion is in close contact with the surface of the primer and seals the LED chip, and the primer is not exposed.

According to the light emitting device of this embodiment, the sealing resin for sealing the LED chip is in close contact with the surface of the primer that covers the bottom face of the recess portion of the substrate. Therefore, when gas contained in the sealing resin is bled out, the gas can be allowed to escape upward without obstruction of the primer. In addition, in a case where the primer is formed on the sealing resin, when gas contained in the sealing resin is bled out, there is no escape place, causing a possibility that the primer may be damaged.

In an embodiment, the sealing resin portion is made from silicone resin.

According to the light emitting device of this embodiment, the light resistance can be improved by the sealing resin made from silicone resin.

In an embodiment, the sealing resin portion contains a fluorophor.

According to the light emitting device of this embodiment, wavelength conversion of light can be done by the fluorophor to emit fluorescent light.

In an embodiment, a refractive index of the sealing resin portion and a refractive index of the primer, both being within a range of 1.2 to 1.8, are generally equal to each other.

According to the light emitting device of this embodiment, since the refractive index of the sealing resin portion and the refractive index of the primer are generally equal to each other, optical losses due to the total reflection at the interface between the sealing resin and the primer can be eliminated.

In an embodiment, the light emitting device comprises a reflector which is placed around the LED chip and which reflects light emitted by the LED chip.

According to the light emitting device of this embodiment, since light from the LED chip is reflected by the reflector, the light attention can be suppressed.

In an embodiment, the reflector and the substrate are made from one identical base material.

According to the light emitting device of this embodiment, the reflector can be made with simplicity.

In an embodiment, a surface of the reflector is made from Ag, or AgBi-based alloy, or AgNd-based alloy, or an Ag alloy containing 0.5 to 5.0 wt % of at least one kind of metal selected from Pt, Au, Cu, Pd, Mg, Ti and Ta.

In an embodiment, the primer covers the surface of the reflector.

According to this embodiment, although the surface of the reflector contains silver that is high in reflectivity but liable to blackening, yet the protection with the primer makes it possible to provide an effective gas barrier.

In an embodiment, a method for producing the light emitting device comprises the step of:
applying the primer onto the surface of the reflector before placing the reflector around the LED chip.

According to this embodiment, the primer can easily be applied uniformly on the surface of the reflector.

There is provided a method for producing a light emitting device, comprising the steps of:

applying a resin-made primer onto a substrate in which a metal portion is formed on its surface and on which an LED chip is mounted so that the resin-made primer covers at least part of the metal portion; and coating the LED chip and at least part of the resin-made primer with a sealing resin and curing the sealing resin, thereby forming a sealing resin portion, wherein the primer is made from a resin higher in gas barrier property than the sealing resin portion.

According to the production method of this embodiment, at least part of the metal portion formed on the surface of the substrate is covered with the primer made from a resin higher in gas barrier property than the sealing resin portion. Therefore, the gas barrier property can be improved.

In an embodiment, the light emitting device is mounted onto a printed board onto which a primer made from a resin material identical to that of the primer has been applied.

According to the mounting method of this embodiment, a light emitting device having a good gas barrier property can be mounted on a printed board having a good gas barrier property.

In an embodiment, a coefficient of thermal expansion of the sealing resin portion and a coefficient of thermal expansion of the primer are generally equal to each other.

According to the light emitting device of this embodiment, impairment of the close contact between the sealing resin and the primer due to influences of heat can be avoided.

Advantageous Effects of Invention

According to the light emitting device of this invention, the LED chip and the primer are sealed with the sealing resin, and moreover the primer, which is made from a resin higher in gas barrier property than the sealing resin portion, covers the metal portion formed on the surface of the substrate. Thus, the gas barrier property can be improved even under heat- or light-susceptible environments.

BRIEF DESCRIPTION OF DRAWINGS

FIG. 3A is a longitudinal sectional view showing a main-part construction of a light emitting device according to a second embodiment of the invention;

FIG. 3B is a longitudinal sectional view showing a modification of the light emitting device according to the second embodiment;

DESCRIPTION OF EMBODIMENTS

Hereinbelow, the present invention will be described in detail by way of embodiments thereof illustrated in the accompanying drawings.

(First Embodiment)

Figure 1:
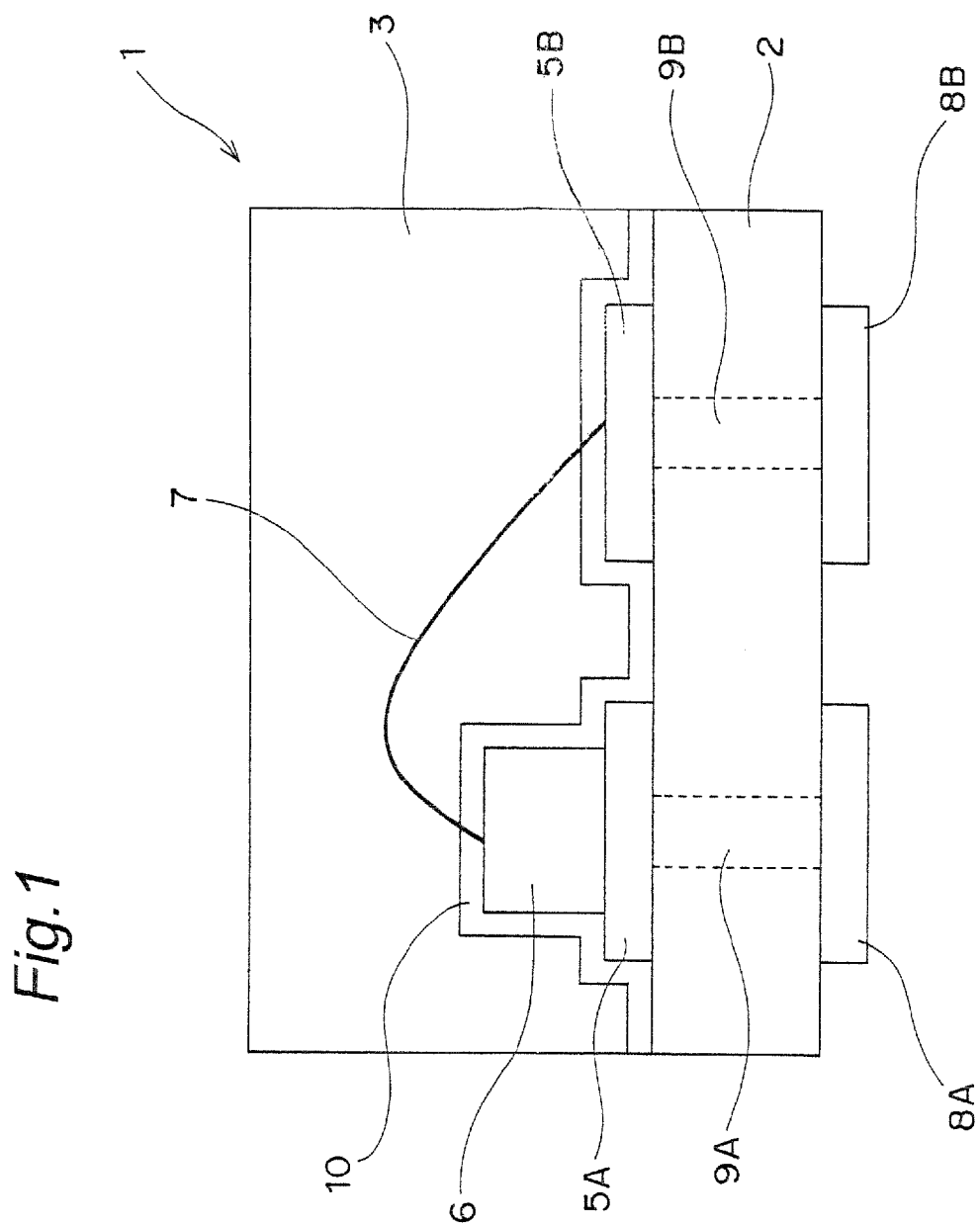
FIG. 1 is a longitudinal sectional view showing a main-part construction of a light emitting device according to a first embodiment of the present invention.

FIG. 1 is a longitudinal sectional view showing an example of the main-part construction of a light emitting device according to a first embodiment of the invention.

As shown in FIG. 1, the light emitting device 1 of this first embodiment includes an LED (Light Emitting Diode) chip 6 mounted on a substrate 2. The LED chip 6 has an anode electrode (not shown) connected to an interconnect pattern 5A formed on the substrate 2, and a cathode electrode (not shown) connected with a bonding wire 7 to another interconnect pattern 5B formed on the substrate 2. The LED chip 6 is a blue LED chip having a primary emission peak in a blue wavelength range of 400 nm to 500 nm wavelengths as an example.

This light emitting device 1 also has a layered primer 10 that covers the LED chip 6, the interconnect patterns 5A, 5B and the substrate 2. The light emitting device 1 further has a sealing resin portion 3 that covers the primer 10 in close contact with the primer 10 to provide a resin sealing of the LED chip 6. In this embodiment, unshown fluorophor and filler for wavelength conversion of light derived from the blue LED chip 6 are added in the sealing resin portion 3. In this first embodiment, an alumina substrate having high optical reflectance for visible light was used as the substrate 2. The thickness of this substrate 2 was set to 0.3 mm as an example. The interconnect patterns 5A, 5B formed on the surface of the substrate 2 were Ag interconnect patterns. It is noted that these interconnect patterns 5A, 5B may also be made from Ag, or AgBi-based alloy, or AgNd-based alloy. The interconnect patterns 5A, 5B may also be made from an Ag alloy containing 0.5 to 5.0 wt % of at least one kind of metal selected from Pt, Au, Cu, Pd, Mg, Ti and Ta.

Further, an external connection electrode 8A is formed on the bottom face side of the substrate 2, and the external connection electrode 8A is electrically connected to the interconnect pattern 5A under the LED chip 6 via a through conductive layer 9A provided so as to extend through the substrate 2 in its thicknesswise direction. Another external connection electrode 83 is also formed on the bottom face side of the substrate 2, and the external connection electrode 83 is electrically connected to the interconnect pattern 5B via a through conductive layer 9B provided so as to extend through the substrate 2 in its thicknesswise direction.

Also in this first embodiment, the primer 10 formed on the substrate 2 so as to cover the LED chip 6, which is made from acrylic resin, is formed to a thickness of 1 μm by application onto the entire surface of the substrate 2 by spin coating process. The thickness of the primer 10 is desirably set within a range of 0.01 μm to 100 μm.

The sealing resin portion 3 covering the primer 10, which is about 0.4 mm thick, seals the LED chip 6 with resin. The sealing resin portion 3 was provided, as an example, by adding silicone resin particles (not shown) having a mean particle size of 5 μm as a filler into dimethyl silicone resin.

In the sealing resin portion 3, an unshown fluorophor that converts wavelength of the light from the blue LED chip 6 to emit fluorescent light is further added. In this first embodiment, as the fluorophor, a yellow fluorophor having a high luminous efficacy and a mean particle size of 5 μm such as Eu:BOSE or ROSE (europium-activated strontium barium orthsilicate, $(Ba.Sr)_2SiO_4$:Eu) was used. This yellow fluorophor absorbs blue light emitted from the blue LED chip 6 and emits yellow fluorescent light having an emission peak in a wavelength range of 550 nm to 600 nm wavelengths.

A surface of the sealing resin portion 3, parallel to the surface of the substrate 2, is a generally flat surface. A side face of the light emitting device 1 in this first embodiment is flat-surface shaped, where the sealing resin portion 3 and moreover the substrate 2 thereunder are cut vertical to the surface of the substrate 2, so that the light emitting device 1 is formed into a rectangular parallelopiped shape, as a whole shape, which is thick in thickness and larger in an area in in-surface directions of the substrate 2. More specifically, the light emitting device 1 has a thickness of 0.7 mm, lateral width of 1.6 mm and a longitudinal width of 2.6 mm as an example. It is noted that the lateral width is a width in a direction parallel to the drawing sheet of FIG. 1 and the longitudinal width is a width in a direction vertical to the drawing sheet of FIG. 1.

In the first embodiment, the acrylic resin used as the primer 10 is a material which is, although as good as generally 100% at gas barrier property in comparison to dimethyl silicone resin of good light resistance used for the sealing resin portion 3, yet cannot be regarded as so good at light resistance. For this reason, the primer 10 using acrylic resin is discolored when subjected to long-time irradiation of short-wavelength, high-energy light such as blue light emitted from the blue LED chip 6, and this causes an optical loss. Therefore, it is desirable that the primer 10 made from the acrylic resin is formed as thin as possible so as to minimize the optical loss.

As described above, applying the primer 10 by spin coating makes it possible to provided a smaller thickness of the primer, yet depressions and projections, if present on the surface of the substrate 2, cause the primer 10 to be thicker at and near those depressions and projections. Therefore, the interconnect patterns 5A, 5B forming the interconnect layer are desirably thinner in layer thickness than the primer 10. Also, the LED chip 6 is preferably one which does not need a bonding wire, such as flip chips, and besides it is desirable that the LED chip 6 has a trapezoidal upper surface as an example so that the substrate surface with the LED chip 6 mounted thereon can be made more flattened.

In addition, the substrate 2 is desirably made from any one of optically reflective resin, metal and ceramic. In this case, since light irradiated from the LED chip 6 is reflected by the substrate 2, the light irradiated from the LED chip 6 can be prevented from attenuating.

Next, a method for producing the light emitting device 1 of the first embodiment is explained in detail with reference to FIG. 1 and FIGS. 2A to 2E. It is noted that FIGS. 2A to 2E are schematic sectional views for explaining individual production steps of the production method for the light emitting device 1 of the first embodiment.

Figure 2A:
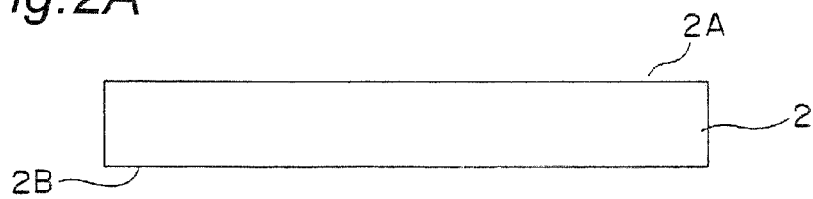
FIG. 2A is a schematic sectional view for explaining production process of the light emitting device according to the first embodiment.

First, FIG. 2A shows the substrate 2. Although not shown in FIG. 2A, the interconnect patterns 5A, 5B, the blue LED chip 6 and the bonding wire 7 shown in FIG. 1 are formed on the top face 2A side of the substrate 2. Also, the interconnect patterns 5A, 5B, the blue LED chip 6 and the bonding wire 7 are provided in plurality on the top face 2A of the substrate 2 longitudinally and laterally in an array. Also although not shown in FIG. 2A, the external connection electrodes 8A, 83 and the through conductive layers 9A, 9B electrically connected to the external connection electrodes 8A, 83 shown in FIG. 1 are formed on the bottom face 23 side of the substrate 2. It is noted that the interconnect patterns 5A, 5B are designed as appropriate in accordance with the array pattern or electrode formation of the LED chip 6. As described before, the interconnect pattern 5A is connected directly to the anode electrode (not shown) of the blue LED chip 6, and the cathode electrode of the blue LED chip 6 is connected to the interconnect pattern 5B by the bonding wire 7.

Figure 2B:
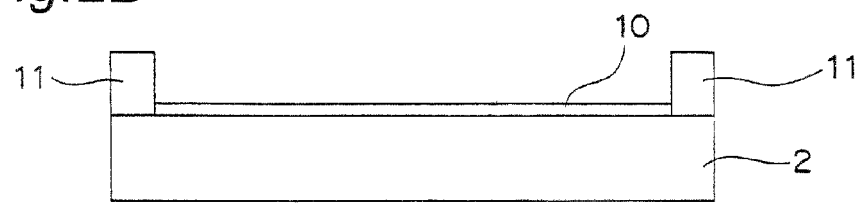
FIG. 2B is a schematic sectional view for explaining production process of the light emitting device according to the first embodiment.

Next, as shown in FIG. 2B, a dam sheet 11 made of the silicone resin is affixed to the substrate 2 on which the LED chip 6 and the bonding wire 7 have been mounted. The dam sheet 11 made of silicone resin is for use of damming the primer 10 and the sealing resin portion 3. Thereafter, by air dispensation, the primer 10 is applied to the surface of the substrate 2, being allowed to dry. Appropriately diluting the primer 10 allows the primer 10 to be reduced in thickness after its drying and after the volatilization of the solvent.

In addition, the procedure may also be that the dam sheet 11 is affixed to the surface of the substrate 2 after the primer 10 is applied onto the surface of the substrate 2 by spin coating process. In this case, the primer 10 can be applied onto the surface of the substrate more uniformly and thinly, and moreover it becomes possible to prevent formation of primer accumulation in recessed corner portions that form border portions between the primer 10 and the dam sheet 11.

Figure 2C:
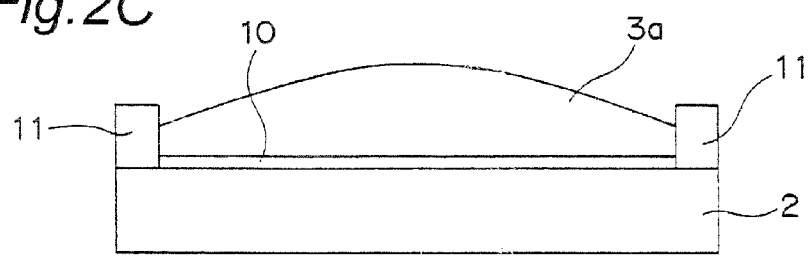
FIG. 2C is a schematic sectional view for explaining production process of the light emitting device according to the first embodiment.

Next, the substrate 2 is set on a press machine including an unshown heating plate and, as shown in FIG. 2C, liquid silicone resin 3a to form the sealing resin portion 3 is injected onto the surface of the substrate by air dispensation. In this liquid silicone resin 3a, unshown fluorophor and filler are added and stirred and defoamed by a stirring and defoaming machine. In this case, the weight ratio of the filler to the liquid silicone resin to the fluorophor was set to 60:100:62 as an example.

Figure 2D:
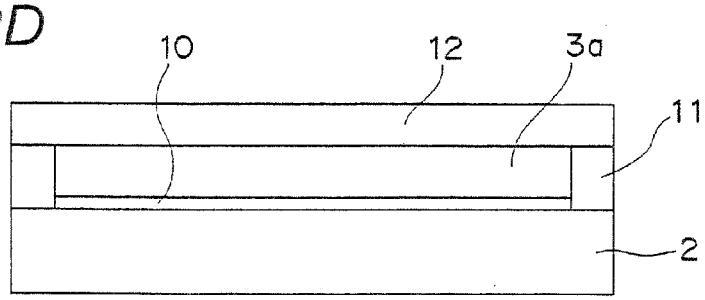
FIG. 2D is a schematic sectional view for explaining production process of the light emitting device according to the first embodiment.

Further, in FIG. 2D, a flat metal mold 12 is pressed onto the surface of the sealing resin 3a to achieve a press. The metal mold 12 has a function of serving as a lid of a mold container to flatten the surface of the sealing resin 3a. Thereafter, the sealing resin 3a is cured by 10-minute heating and pressing at 100° C., by which the sealing resin portion 3 is formed.

Figure 2E:
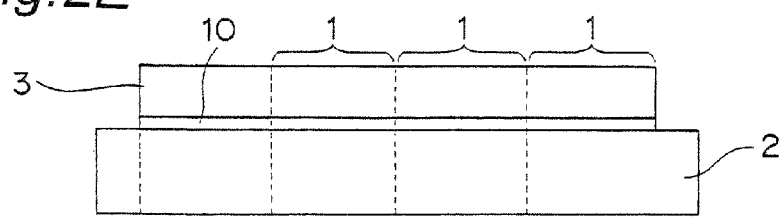
FIG. 2E is a schematic sectional view for explaining production process of the light emitting device according to the first embodiment.

Further, in FIG. 2E, dicing of the substrate 2 and the sealing resin portion 3 on the substrate 2 into a specified size so that individual light emitting devices 1 are cut apart. This dicing is performed in accordance with the above-described interconnect patterns. Through the steps described above, the individual light emitting devices 1 diced into chips are formed.

As shown above, the production method for the light emitting device 1 of the first embodiment includes a step for applying the primer 10 to the substrate 2 on which the LED chip 6 as a light emitting element and the bonding wire 7 have been mounted, a step for mixing and stirring the sealing resin 3a with fluorophor and filler added thereto, a step for covering the surface 2A of the substrate 2, on which the LED chip 6 has been mounted, with the sealing resin 3a with fluorophor and filler added thereto, a step for flattening and heating the surface by a press to make the sealing resin material 3a cured, and a dicing step for cutting apart individual light emitting devices 1.

The light emitting device 1 fabricated in this way was subjected to a sulfuration accelerated test under 40° C., 80% RH, $H_2S$ 3 ppm and 80-hour leaving conditions, after which almost no discoloration of the Ag interconnect patterns 5A, 5B was seen. On the other hand, a light emitting device of a comparative example fabricated without applying the primer 10 was discolored black by the sulfuration accelerated test. As to a ratio based on an initial value, the light emitting device 1 of this embodiment resulted in an axial luminosity of 88%, while the comparative example (with no primer) resulted in an axial luminosity of 60%.

In addition, the primer 10 desirably has a thickness within a range of 0.01 µm to 100 µm. The upper-limit value 100 µm of the thickness of the primer 10 depends on a limit value of brightness lowering rate due to light loss by discoloration-induced yellowing caused by heat and light, while the lower-limit value 0.01 µm depends on coating irregularities and an upper limit of gas permeation amount. This is applicable in common to the following individual embodiments.

The primer 10 typified by acrylic resins is high in gas barrier property, particularly compared with dimethyl-based silicone resin. On the other hand, such primers as acrylic resins are, in general, inferior in light resistance to the sealing resin portion 3. Therefore, combining the smaller-in-thickness primer 10 with the sealing resin portion 3 makes it possible to provide a structure superior in both gas barrier property and light resistance.

According to the light emitting device 1 of the first embodiment, blackening of the interconnect patterns 5A, 5B formed of silver patterns can be prevented so that decreases of the reflectivity and decreases of the luminosity and chromaticity can be prevented. Also, according to the above-described production process shown in FIGS. 2A to 2E, the process is the same as the conventional one except that the application and drying step of the primer 10 is executed before the formation of the sealing resin portion 3, thus the production process being simple and cost-increase suppressed. Further, the primer 10 has a refractive index generally equal to that of the sealing resin portion 3 (1.4 to 1.5 in both cases), and is excellent in light transmissivity. It is noted that the refractive index of the sealing resin portion 3 and the refractive index of the primer 10 may be set generally equal to each other within a range of 1.2 to 1.8.

(Second Embodiment)

Next, a light emitting device 21 according to a second embodiment of the invention is described with reference to FIG. 3A. FIG. 3A is a longitudinal sectional view showing a main-part construction of the light emitting device 21.

As shown in FIG. 3A, in the light emitting device 21 of the second embodiment, a first LED chip 26 is mounted on a first portion 25A of a first lead frame 25 so that a lower electrode of the first LED chip 26 is electrically connected to the first portion 25A. Also, a second portion 25B of the first lead frame 25 is placed so as to be apart from the first portion 25A, and the second portion 25B is electrically connected to an upper electrode of the first LED chip 26 by a gold wire 27. Further, the first, second portions 25A, 25B of the first lead frame 25 are fixed by a resin portion 22 which surrounds the periphery of the LED chip 26 and which is formed by insert molding. The first portion 25A of the first lead frame 25, which extends outward from the surface on which the LED chip 26 is mounted, is formed so as to surround one end portion 28 of a base portion 22A of the resin portion 22. That is, the first portion 25A is bent over a top face 22A-1, a side face 22A-2 and a bottom face 22A-3 of the base portion 22A, by which an external connection terminal 31 to be electrically connected to a mount board or the like is provided. The base portion 22A forms a base substrate. Also, the second portion 25B of the first lead frame 25 is similar in shape to the first portion 25A. That is, the second portion 25B, which extends outward from the surface on which the LED chip 26 is mounted, is formed so as to surround the other end portion 29 of the base portion 22A. The second portion 25B is bent over a top face 22A-4, a side face 22A-5 and a bottom face 22A-6 of the base portion 22A, by which an external connection terminal 32 to be electrically connected to a mount board or the like is provided. The resin portion 22 has wall portions 22B, 22B protruding from both ends of the base portion 22A.

The first, second portions 25A, 25B of the first lead frame 25 may have, on their surfaces, a surface layer (not shown) for enhancing the reflectivity of light emitted from the LED chip 26, where the surface layer may be made from, for example, Ag or AgBi-based alloy, or AgNd-based alloy. Also, the surface layer may be made from an Ag alloy containing 0.5 to 5.0 wt % of at least one kind of metal selected from among Pt, Au, Cu, Pd, Mg, Ti and Ta. With an Ag alloy used, the optical reflectance, although somewhat lower than that of pure Ag, is yet even a little improved in terms of deteriorations due to corrosive gas or moisture. The surface layer, particularly with Ag used therefor, is covered with the primer only within the LED chip mounting surface as described later, thus providing deterioration countermeasures for the surface layer. Therefore, the surface layer is preferably provided only within the LED chip mounting surface, and desirably not formed at portions that extend along the side faces and the bottom faces of the resin portion 22 within the first, second portions 25A, 25B of the lead frame so as to be exposed outside.

In this second embodiment, in addition to the first LED chip 26 shown in FIG. 3A, second, third LED chips (not shown) are mounted on second, third lead frames (not shown), respectively, on a deeper side beyond the drawing sheet of FIG. 3A. Anode electrodes and cathode electrodes of these second, third LED chips are connected to the second, third lead frames (not shown) formed on the base portion 22A of the resin portion 22 independent of the first lead frame 25 on which the first LED chip 26 is mounted. The first LED chip 26 is a blue LED chip having a primary emission peak in a blue wavelength range of 400 nm to 500 nm wavelengths. The second LED chip is a green LED chip having a primary emission peak in a green wavelength range of 480 nm to 580 nm wavelengths. The third LED chip is a red LED chip having a primary emission peak in a red wavelength range of 600 nm to 700 nm wavelengths.

These first to third LED chips are coated with a layered primer 30. Further, a sealing resin portion 23 with silica and an anti-settling additive added thereto is formed so as to cover the top of the primer 30 and come into close contact with the primer 30, so that the first to third LED chips are resin-sealed by the sealing resin portion 23.

As the insert-molded resin portion 22, a white resin that reflects light is preferably adoptable, and PPA (polyphthalamide) was adopted in this second embodiment. Whereas its use with high brightness may involve a phenomenon that the surface layer made from Ag or Ag alloy on the surfaces of the first, second portions 25A, 25B reacts with moisture absorbed by the sealing resin portion 23 so as to be blackened, this blackening can also be prevented by the coating with the primer 30. The thickness of the resin portion 22 was set to 1.4 mm. Also, the second, third lead frames, like the first lead frame 25, also extend from side faces 22A-1, 22A-2 to bottom faces 22A-3, 22A-6 of the base portion 22A to form third external connection electrodes 31, 32.

As shown in FIG. 3A, a metal reflection coating 33 is formed by Ag plating on an inner wall surface 22D of the wall portion 22B in the resin portion 22. The metal reflection coating 33 and the wall portion 22B constitute a reflector. It is noted that the metal reflection coating 33 may also be made from Ag or AgBi-based alloy, or AgNd-based alloy. The metal reflection coating 33 may also be made from an Ag alloy containing 0.5 to 5.0 wt % of at least one kind of metal selected from Pt, Au, Cu, Pd, Mg, Ti and Ta.

Then, the primer 30 of silane-based resin is applied by air dispensation process at thicknesses of 1 to 10 μm so as to cover the metal reflection coating 33, the first to third lead frames, the first to third LED chips and the base portion 22A.

In this second embodiment, the primer 30 is smallest in thickness as thin as 1 μm in the first portion 30A covering the metal reflection coating 33, largest in thickness as thick as 10 μm in the second portion 30B on the interconnect pattern, and 4 μm thick at the third portion 300 on the base portion 22A. The sealing resin portion 23 covering the primer 30 is 0.7 mm thick. In the sealing resin portion 23, silica and an anti-settling additive having a mean particle size of 5 μm are added into the silicone resin.

The light emitting device 21 of this second embodiment has sizes of a thickness of 1.4 mm, a lateral width of 3.2 mm and a longitudinal width of 2.8 mm. It is noted that the lateral width means a width in a direction parallel to the drawing sheet in FIG. 3A, and the longitudinal width means a width in a direction vertical to the drawing sheet in FIG. 3A.

In addition, in the second embodiment, the metal reflection coating 33 formed on the inner wall surface 22D of the wall portion 22B in the resin portion 22 may be omitted.

In this second embodiment, combining the thin primer 30 with the sealing resin portion 23 makes it possible to provide a structure superior in both gas barrier property and light resistance. As a result of this, blackening of the interconnect patterns formed of silver patterns and the metal reflection coating 33 can be prevented so that decreases of the reflectivity and decreases of the luminosity and chromaticity can be prevented. Also, in this second embodiment, the fabrication process can be achieved by the same process as the conventional one except that the application and drying step of the primer 30 is executed before the formation step of the sealing resin portion 23, thus the production process being simple and cost-increase suppressed. Further, the primer 30 has a refractive index generally equal to that of the sealing resin portion 23 (1.4 to 1.5 in both cases), and decreases of light extraction efficiency can be suppressed without occurrence of refraction or scattering at the interface between the primer 30 and the sealing resin portion 23. Also, since the primer 30 is applied also on the surface of the base portion 22A of the resin portion 22 and the metal reflection coating 33, close contact between the resin portion 22 or the metal reflection coating 33 and the sealing resin portion 23 can be enhanced.

Next, a modification of the second embodiment is described with reference to FIG. 3B. This modification differs from the second embodiment in that a primer 35 which covers not only places covered with the primer 30 in FIG. 3A but also the side faces of the resin portion 22 and the first to third lead frame portions formed along the side faces is included instead of the primer 30 of FIG. 3A. Besides, this modification differs from the second embodiment in that no metal reflection coating 33 is formed on the wall surface 22D of the wall portion 22B in the resin portion 22.

In a light emitting device 21A of this modification, the primer 35 is formed by dip coating on surfaces of the resin portion 22, the first to third LED chips and the first to third lead frames. As shown in FIG. 33, the primer 35 covers not only the inner wall surface 22D but also an outer wall surface 22E of the wall portion 22B of the resin portion 22, and further covers the side portions 25A-1, 25B-1 of the first lead frame 25 and side portions of the second, third lead frames.

Desirably, the primer 35 serves as coating of all the portions where the metal surface is exposed on the surface except the external connection electrodes 31, 32 that form mounting surfaces of the first, second portions 25A, 25B of the first lead frame 25 as well as except the external connection electrodes (not shown) that form mounting surfaces of the second, third lead frames.

The light emitting device 21A of this modification has side light emitting LEDs as the first to third LED chips, and has sizes of a thickness of 1.2 mm, a lateral width of 3.8 mm and a longitudinal width of 0.6 mm.

In this modification, since a narrow recess portion U is between the wall portion 22S of the resin portion 22 and the first to third LED chips, coating of the primer 35 was fulfilled by dipping process. In the coating by dipping process, the primer 35 tends to vary in thickness, and therefore a difference between the refractive index of the primer 35 and the refractive index of the sealing resin portion 23 causes the light scattering lost to increase. Accordingly, in the case of this modification, it is desirable that the refractive index of the primer 35 and the refractive index of the sealing resin portion 23 are, in particular, of an equivalent level.

Also, as shown in FIG. 3B, preferably, the sealing resin portion 23 is formed so as to be in close contact with the surface of at least part of the primer 35. Particularly, when there is a side face surrounding the periphery of the primer 35 (inner wall surface 22D of wall portion 22B) as shown in FIGS. 3A and 3B, it is preferable to form first the primer 35 and then the sealing resin portion 23. In the case where the primer 35 is formed on the sealing resin portion 23 conversely, when gas contained in the sealing resin portion 23 is bled out, there is no escape place sideways from within the light emitting device (package) 1 so that the gas is inevitably directed upward, causing a possibility that the primer 35 may be damaged. Thus, it is preferable to form the primer 35 before forming the sealing resin portion 23.

(Third Embodiment)

Figure 4A:
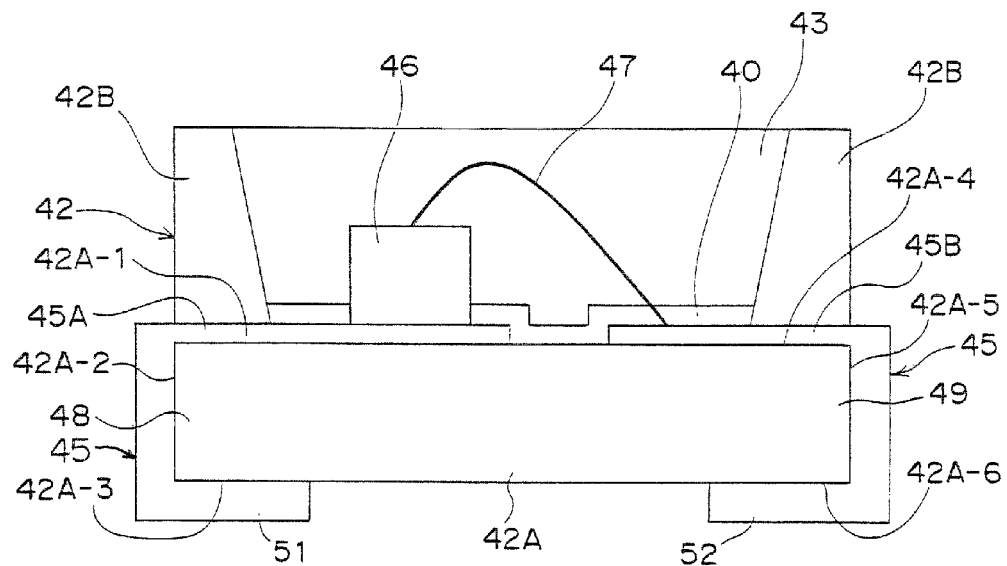
FIG. 4A is a longitudinal sectional view showing a main-part construction of a light emitting device according to a third embodiment of the invention.

FIG. 4A is a longitudinal sectional view showing a main-part construction of a light emitting device according to a third embodiment of the invention.

As shown in FIG. 4A, in the light emitting device of the third embodiment, an LED chip 46 is mounted on a first portion 45A of a lead frame 45 so that a lower electrode of the LED chip 46 is electrically connected to the first portion 45A. The LED chip 46 is a blue LED chip having a primary emission peak in a blue wavelength range of 400 nm to 500 nm wavelengths. Also, a second portion 45B of the lead frame 45 is placed so as to be apart from the first portion 45A, and the second portion 45B is electrically connected to an upper electrode of the LED chip 46 by a gold wire 47. Further, the first, second portions 45A, 45B of the lead frame 45 are fixed by a resin portion 42 which surrounds the periphery of the LED chip 46 and which is formed by insert molding. The first portion 45A of the lead frame 45, which extends outward from the surface on which the LED chip 46 is mounted, is formed so as to surround one end portion 48 of a base portion 42A of the resin portion 42. That is, the first portion 45A is bent over a top face 42A-1, a side face 42A-2 and a bottom face 42A-3 of the base portion 42A, by which an external connection terminal 51 to be electrically connected to a mount board or the like is provided. The base portion 42A forms a base substrate. Also, the second portion 45B of the lead frame 45 is similar in shape to the first portion 45A. That is, the second portion 45B, which extends outward from the surface on which the LED chip 46 is mounted, is formed so as to surround the other end portion 49 of the base portion 42A. The second portion 45B is bent over a top face 42A-4, a side face 42A-5 and a bottom face 42A-6 of the base portion 42A, by which an external connection terminal 52 to be electrically connected to a mount board or the like is provided. The resin portion 42 has wall portions 42B, 42B protruding from both ends of the base portion 42A.

The first, second portions 45A, 45B of the lead frame 45 may have, on their surfaces, a surface layer (not shown) for enhancing the reflectivity of light emitted from the LED chip 46, where the surface layer may be made from, for example, Ag or AgBi-based alloy, or AgNd-based alloy. Also, the surface layer may be made from an Ag alloy containing 0.5 to 5.0 wt % of at least one kind of metal selected from among Pt, Au, Cu, Pd, Mg, Ti and Ta. With an Ag alloy used, the optical reflectance, although somewhat lower than that of pure Ag, is yet even a little improved in terms of deteriorations due to corrosive gas or moisture. The surface layer, particularly with Ag used therefor, is covered with the primer only within the LED chip mounting surface as described later, thus providing deterioration countermeasures for the surface layer. Therefore, the surface layer is preferably provided only within the LED chip mounting surface, and desirably not formed at portions that extend along the side faces and the bottom faces of the resin portion 42 within the first, second portions 45A, 45B of the lead frame 45 so as to be exposed outside.

In this third embodiment, a layered primer 40 is applied on the first, second portions 45A, 45B of the lead frame 45 and the base portion 42A of the resin portion 42. Also, a sealing resin portion 43 is formed so as to cover the primer 40, the LED chip 46 and the inner wall surface of the wall portion 42B. This sealing resin portion 43 is in close contact with the surface of the primer 40. The sealing resin portion 43 is made from a sealing resin to which added is a fluorophor (not shown) that performs wavelength conversion of light derived from the blue LED chip 46.

As the insert-molded resin portion 42, a white resin that reflects light is preferably adoptable, and PPA (polyphthalamide) was adopted in this third embodiment. Whereas its use with high brightness may involve a phenomenon that the surface layer made from Ag or Ag alloy on the surfaces of the first, second portions 45A, 45B reacts with moisture absorbed by the sealing resin portion so as to be blackened, this blackening can also be prevented by the coating with the primer 40. The thickness of the resin portion 42 was set to 1.4 mm.

In this third embodiment, the primer 40 is formed by applying and drying an acrylic modified resin by dispensing process to a mean thickness of 2 μm. Also, the primer 40 is formed with selected dispensing places so as to cover surfaces exposed to around the direct mounting portion for the blue LED chip 46 of the first portion 45A, but not to cover the LED chip 46, and to cover the base portion 42A exposed from the first, second portions 45A, 45B. Further, the sealing resin portion 43 that covers the primer 40, the LED chip 46 and the wall portion 42B is formed at a thickness of 0.4 mm.

In this sealing resin portion 43, a fluorophor (not shown) that performs wavelength conversion of light derived from the blue LED chip 46 to emit fluorescent light is added in a silicone resin. In this third embodiment, as an example of the fluorophor, a yellow fluorophor having a high luminous efficacy and a mean particle size of 6 μm such as Ce:YAG (cerium-activated yttrium-aluminum-garnet) was used. This yellow fluorophor absorbs blue light emitted from the blue LED chip 46 and emits yellow fluorescent light having an emission peak in a wavelength range of 550 nm to 600 nm wavelengths. Also, a surface of the sealing resin portion 43, parallel to the surface of the base portion 42A forming the substrate, is a generally flat surface. More specifically, the light emitting device of this third embodiment has a thickness of 1.5 mm, lateral width of 5.0 mm and a longitudinal width of 5.0 mm as an example.

Figure 4B:
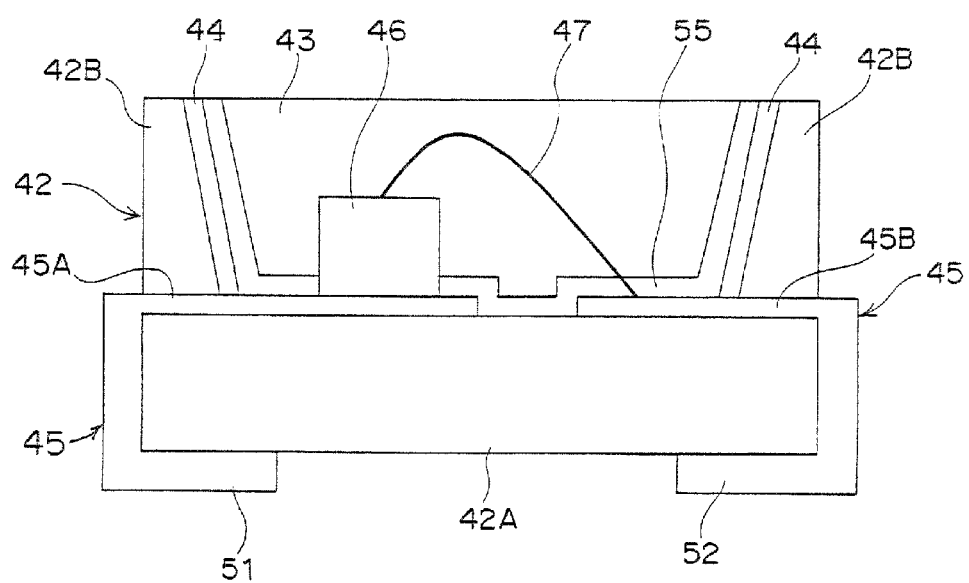
FIG. 4B is a longitudinal sectional view showing a modification of the light emitting device according to the third embodiment.

Next, FIG. 4B shows a modification of the third embodiment. This modification differs from the third embodiment in that a metal reflection coating 44 by Ag plating is formed on the inner wall surface of the wall portion 42B of the resin portion 42 and that a primer 55 which covers this metal reflection coating 44 is included. The metal reflection coating 44 and the wall portion 42B constitute a reflector. It is noted that the metal reflection coating 44 may be made from Ag or AgBi-based alloy, or AgNd-based alloy. The metal reflection coating 44 may also be made from an Ag alloy containing 0.5 to 5.0 wt % of at least one kind of metal selected from Pt, Au, Cu, Pd, Mg, Ti and Ta.

The primer 55, like the above-described primer 40, is formed with selected dispensing places so as to cover surfaces exposed to around the direct mounting portion for the blue LED chip 46 of the first portion 45A of the lead frame 45, but not to cover the LED chip 46, and to cover the base portion 42A of the resin portion 42 exposed from the first portion 45A and the second portion 45B of the lead frame 45.

In this modification, primer coating may be done independently for the surface portions of the first portion 45A other than chip mounting portion and for the inner wall surface of the wall portion 42B forming the reflector, during the formation process of the primer 55. In this case, there is an advantage that the primer 55 can easily be made uniform in thickness among individual places.

In the third embodiment and its modification, combining the thin primer 55 with the sealing resin portion 43 makes it possible to provide a structure superior in both gas barrier property and heat resistance. As a result of this, blackening of silver patterns forming the first, second portions 45A, 45B of the lead frame 45 and the metal reflection coating 44 can be prevented so that decreases of the reflectivity and decreases of the luminosity and chromaticity can be prevented. Also, the fabrication process can be achieved by the same process as the conventional one except that the application and drying step of the primer 40, 55 is executed before the formation step of the sealing resin portion 43, thus the production process being simple and cost-increase suppressed. Further, since the primer 40, 55 does not cover the LED chip 46, there occurs neither attenuation nor confusion of light, and moreover discoloration of the primer 40, 55 due to heat generation of the LED chip 46 can be prevented. Besides, the primer 40, 55 has a refractive index generally equal to that of the sealing resin portion 43 (1.4 to 1.5 in both cases), being excellent in light transmissivity. Also, since the primer 40, 55 is applied also on the surface of the base portion 42A of the resin portion 42 and the metal reflection coating 44, close contact between the resin portion 42 or the metal reflection coating 44 and the sealing resin portion 43 can be enhanced.

Preferably, as shown in FIGS. 4A and 4B, the sealing resin portion 43 is formed so as to be in close contact with the surface of at least part of the primer 40, 55. Particularly, when there is a side face surrounding the periphery of the primer 40, 55 (inner wall surface of wall portion 42B) as shown in FIGS. 4A and 4B, it is preferable to form first the primer 40, 55 and then the sealing resin portion 43. Meanwhile, in the case where the primer 40, 55 is formed on the sealing resin portion 43, when gas contained in the sealing resin portion 43 is bled there is no escape place sideways from within the light emitting device (package) so that the gas is inevitably directed upward, causing a possibility that the primer 40, 55 may be damaged. Thus, it is preferable to form the primer 40, 55 before forming the sealing resin portion 43.

(Fourth Embodiment)

Figure 5A:
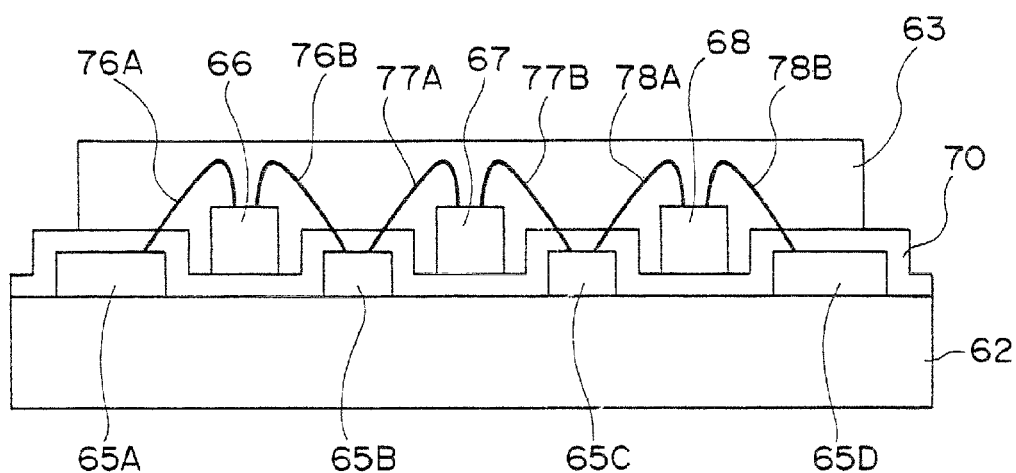
FIG. 5A is a longitudinal sectional view showing a main-part construction of a light emitting device according to a fourth embodiment of the invention.

Next, a light emitting device according to a fourth embodiment of the invention is described with reference to FIG. 5A. FIG. 5A is a longitudinal sectional view showing a main-part construction of the light emitting device according to the fourth embodiment.

In the light emitting device of this fourth embodiment, as shown in FIG. 5A, interconnect patterns 65A-65D are formed on a substrate 62. It is noted that the interconnect patterns 65A-65D may be made from Ag or AgBi-based alloy, or AgNd-based alloy. The interconnect patterns 65A-65D may also be made from an Ag alloy containing 0.5 to 5.0 wt % of at least one kind of metal selected from Pt, Au, Cu, Pd, Mg, Ti and Ta.

Then, a layered primer 70 is applied on the interconnect patterns 65A-65D and the surface of the substrate 62 exposed from the interconnect patterns 65A-65D by dipping process. Blue LED chips 66, 67, 68 having a primary emission peak in a blue wavelength range of 400 nm to 500 nm wavelengths are mounted on the primer 70. Further, a sealing resin portion 63 is formed so as to cover these blue LED chips 66-68 and the primer 70. In this sealing resin portion 63, a fluorophor (not shown) that performs wavelength conversion of light derived from the blue LED chips 66-68 is added.

In this fourth embodiment, a 96%-alumina substrate having a high optical reflectance for visible light was used as the substrate 62. A thickness of the substrate 62 was set to 1.5 mm. Also, the interconnect patterns 65A-65D formed on the surface of the substrate 62 are made from Au/Ni/AgPd. The primer 70 is a 5 μm-thick urethane resin-based primer applied on the entire top surface of the substrate 62 including the interconnect patterns 65A-65D.

The blue LED chip 66 is mounted on the primer 70 between the anode-side interconnect pattern 65B and the cathode-side interconnect pattern 65A via a die-bond paste. In this blue LED chip 66, its anode-side electrode is connected to the anode-side interconnect pattern 65B by a gold wire 76B, and its cathode-side electrode is connected to the cathode-side interconnect pattern 65A by a gold wire 76A.

Also, the blue LED chip 67 is mounted on the primer 70 between the anode-side interconnect pattern 65B and the cathode-side interconnect pattern 65C via a die-bond paste. In this blue LED chip 67, its anode-side electrode is connected to the anode-side interconnect pattern 65B by a gold wire 77A, and its cathode-side electrode is connected to the cathode-side interconnect pattern 65C by a gold wire 77B.

Also, the blue LED chip 68 is mounted on the primer 70 between the anode-side interconnect pattern 65D and the cathode-side interconnect pattern 65C via a die-bond paste. In this blue LED chip 68, its anode-side electrode is connected to the anode-side interconnect pattern 65D by a gold wire 78B, and its cathode-side electrode is connected to the cathode-side interconnect pattern 65C by a gold wire 78A.

In this embodiment, those three blue LED chips 66-68 are arranged and connected in series. In this embodiment also, 11 LED chips (not shown) similar to the LED chip 66 are arrayed and connected in parallel on the depth side of the drawing sheet of FIG. 5A. Also, 11 LED chips (not shown) similar to the LED chip 67 are arrayed and connected in parallel on the depth side of the drawing sheet of FIG. 5A. Also, 11 LED chips (not shown) similar to the LED chip 68 are arrayed and connected in parallel on the depth side of the drawing sheet of FIG. 5A.

In this embodiment, those individual LED chips including the LED chips 66-68 are subjected to die bonding and wire bonding in a state in which the primer 70 has been formed. Also, in FIG. 5A, both-end interconnect patterns 65A, 65D extend to form external connection electrodes.

The mounting of the individual LED chips including the LED chips 66-68 is performed via die-bond paste as described above. However, the primer 70 may be used instead of the die-bond paste in the case where viscosity and adhesion of the primer 70 are tuned as required and the LED chips are mounted on the substrate 62 before the curing of the primer 70.

A sealing resin portion 63 is formed so as to provide a 0.4 mm thick resin sealing of methylsilicone resin on the LED chips and the primer 70. This sealing resin portion 63 can be fabricated by injecting and curing the sealing resin onto the substrate 62 with a dam sheet (not shown) made of Teflon (registered trademark), and then removing the dam sheet. In the silicone resin that forms the sealing resin portion 63, a fluorophor (not shown) that performs wavelength conversion of light derived from the blue LED chips 66-68 to emit fluorescent light is added. The sealing resin portion 63 is in close contact with the primer 70.

Also in this fourth embodiment, particles of the fluorophor include a red fluorophor made of europium-activated pure nitride fluorophor ((Sr.Ca)AlSiN$_3$:Eu) having a mean particle size of 5 μm, and a green fluorophor made of a europium-activated fluorophor ((Si.Al)$_6$(O.N)$_8$:Eu). The red fluorophor performs wavelength conversion of light derived from the blue LED chips 66-68 to emit red fluorescent light having an emission peak in a wavelength range of 600 nm to 750 nm wavelengths. Also, the green fluorophor emits green fluorescent light having an emission peak in a wavelength range of 490 nm to 600 nm wavelengths.

A surface of the sealing resin portion 63, parallel to the surface of the substrate 62, is a generally flat surface. More specifically, the light emitting device of this fourth embodiment has a thickness of 1.5 mm, a lateral width of 18.0 mm and a longitudinal width of 18.0 mm as an example.

Figure 5B:
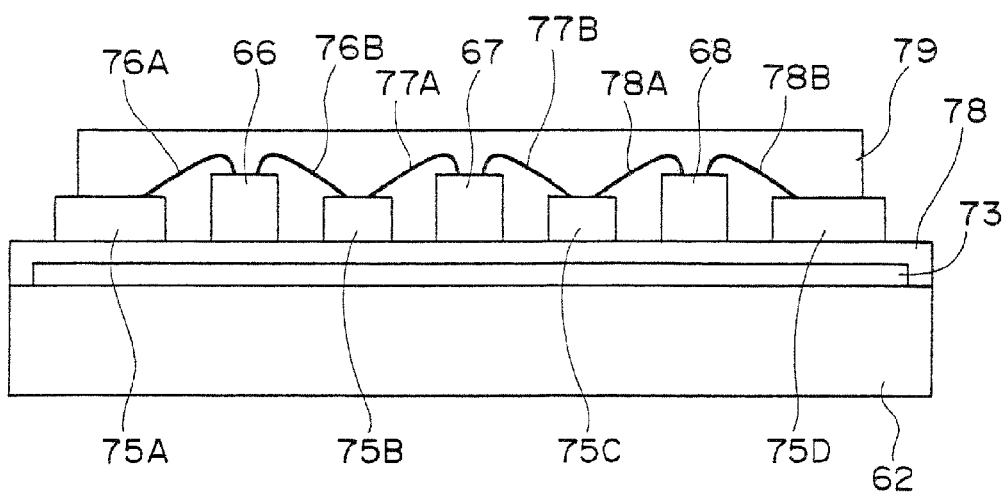
FIG. 5B is a longitudinal sectional view showing a modification of the light emitting device according to the fourth embodiment.

Next, a modification of the fourth embodiment is shown in FIG. 5B. In this modification, a metal reflection coating 73 by Ag plating is formed on a surface of the substrate 62. It is noted that the metal reflection coating 73 may be made from Ag or AgBi-based alloy, or AgNd-based alloy. The metal reflection coating 73 may also be made from an Ag alloy containing 0.5 to 5.0 wt % of at least one kind of metal selected from Pt, Au, Cu, Pd, Mg, Ti and Ta.

Then, a primer 78 is applied at a thickness of 60 μm so as to cover the metal reflection coating 73. Further, Au/Ni/W interconnect patterns 75A, 75B, 75C, 75D are formed on the primer 78. The primer 78 functions as an insulating layer between the metal reflection coating 73 and the individual interconnect patterns 75A-75D.

The blue LED chip 66 is mounted on the primer 78 between the anode-side interconnect pattern 75B and the cathode-side interconnect pattern 75A via a die-bond paste. In this blue LED chip 66, its anode-side electrode is connected to the anode-side interconnect pattern 75B by a gold wire 76B, and its cathode-side electrode is connected to the cathode-side interconnect pattern 75A by a gold wire 76A.

Also, the blue LED chip 67 is mounted on the primer 78 between the anode-side interconnect pattern 75B and the cathode-side interconnect pattern 75C via a die-bond paste. In this blue LED chip 67, its anode-side electrode is connected to the anode-side interconnect pattern 75B by a gold wire 77A, and its cathode-side electrode is connected to the cathode-side interconnect pattern 75O by a gold wire 77B.

Also, the blue LED chip 68 is mounted on the primer 78 between the anode-side interconnect pattern 75D and the cathode-side interconnect pattern 75C via a die-bond paste. In this blue LED chip 68, its anode-side electrode is connected to the anode-side interconnect pattern 75D by a gold wire 78B, and its cathode-side electrode is connected to the cathode-side interconnect pattern 75C by a gold wire 78A.

In this modification, a sealing resin portion 79 formed in the same manner as the sealing resin portion 63 of the above-described fourth embodiment is included. In FIG. 5B, both-end interconnect patterns 75A, 75D extend to form external connection electrodes. Also in this modification, the primer 78 may cover not only the upper surface of the substrate 62 but its entire surface.

In the fourth embodiment and its modification, combining the thin primer 70, 78 with the sealing resin portion 63, 79 makes it possible to provide a structure superior in both gas barrier property and heat resistance. As a result of this, corrosion of AgPd that is the basis of the interconnect pattern 65A-65D, 75A-75D, or Ag of the metal reflection coating 73 portion, can be prevented so that decreases of the reliability and decreases of the luminosity and chromaticity can be prevented. Also, in the fourth embodiment and the modification, the fabrication process can be achieved by the same process as the conventional one except that the application and drying step of the primer 70, 78 is executed before the die-bonding step or the interconnect pattern formation step, thus the production process being simple and cost-increase suppressed. Besides, the primer 70, 78 has a refractive index generally equal to that of the sealing resin portion 63, 79 (1.4 to 1.5 in both cases), being excellent in light transmissivity. Further, since the primer 70, 78 is not applied on the top surfaces of the individual LED chips, there occurs neither attenuation nor confusion of light, so that stable characteristics can be obtained.

(Fifth Embodiment)

Figure 6:
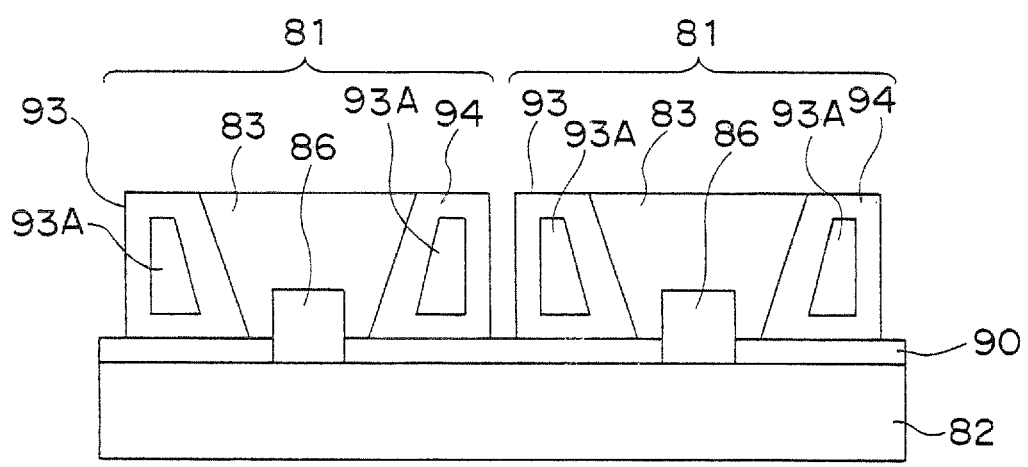
FIG. 6 is a longitudinal sectional view showing a main-part construction of a light emitting device according to a fifth embodiment of the invention.

Next, a light emitting device according to a fifth embodiment of the invention is described with reference to FIG. 6. FIG. 6 is a longitudinal sectional view showing a main-part construction example of the light emitting device according to the fifth embodiment.

As shown in FIG. 6, a plurality of light emitting units 81 mounted on a substrate 82 are included in the light emitting device of this fifth embodiment. The light emitting units 81 are sealed with resin at a thickness of 0.3 mm by a resin sealing portion formed on a 0.3 mm thick alumina substrate.

Each light emitting unit 81 has a blue LED chip 86 having a primary emission peak in a blue wavelength range of 400 nm to 500 nm wavelengths. This blue LED chip 86 is mounted on the substrate 82. As shown in FIG. 6, an 0.5 µm thick epoxy resin-based primer 90 is applied over regions of the top surface of the substrate 82 other than its regions over which the LED chip 86 is mounted.

Also, a reflector member 93 is attached onto the primer 90 so as to surround each LED chip 86. This reflector member 93 has an Ag-plated reflecting surface 93A, and peripheries of the reflecting surface 93A are dip coated with a primer 94 of acrylic resin beforehand. Also, a sealing resin portion 83 is formed so as to cover the reflector member 93, the primer 90 and the LED chip 86. The sealing resin portion 83 is made from a sealing resin with a fluorophor added thereto, and serves for resin sealing of the LED chip 86. It is noted that the fluorophor may be one which emits light yellow. Further, it is also possible that the sealing resin does not contain any fluorophor and a combination of LED chips for individual RGB (Red, Green, Blue) colors and a sealing resin portion containing no fluorophor is adopted.

In this fifth embodiment, a glass epoxy printed board was used as the substrate 82. A thickness of the substrate 82 was set to 1.0 mm. Also, unshown Cu interconnect patterns are formed on the surface of the substrate 82. The light emitting units 81 are mounted on the Cu interconnect patterns. The sealing resin portion 83 may also be lens-shaped. Further, the above-described reflector member 93 may also be given by a metal block having a Ag-plated surface.

In this fifth embodiment, combining the thin primer 90 with the sealing resin portion 83 makes it possible to provide a structure superior in both gas barrier property and heat resistance. As a result of this, Cu blackening of the Cu interconnect patterns (not shown) can be prevented so that decreases of the reliability and decreases of the luminosity and chromaticity can be prevented. Also, in the fifth embodiment, the production process can be achieved by a simple, cost-increase suppressed process because the primer 90 is applied on the entire surface of the substrate 82 other than the mounting portion of the LED chip 86.

Also in this fifth embodiment, since the primer 90 is applied on the entire surface of the substrate 82 around the LED chips, the gas barrier property (halogen resistance) of the substrate as a whole can be enhanced. Therefore, the light emitting device can be suitably used as LED devices for vehicle and backlight use. Also, primer coating for the reflector members 93 of the individual light emitting units 81 is performed independently and separately, there is an advantage that the primer can easily be made uniform in thickness among the individual reflector members 93. Besides, the primer 90, 94 has a refractive index generally equal to that of the sealing resin portion 83 (1.4 to 1.5 in both cases), being excellent in light transmissivity. Further, since the primer is not applied on the sealing resin portion 83, light is transmitted therethrough without incurring attenuation or confusion of light, eliminating a fear for explosion of gas contained in the sealing resin portion.

In addition, in the first to fifth embodiments, it is desirable that the coefficient of thermal expansion of the sealing resin portion and the coefficient of thermal expansion of the primer are generally equal to each other. In this case, impairment of close contact between the sealing resin and the primer due to heat can be avoided.

REFERENCE SIGNS LIST 1, 21 . . . light emitting device
2, 62, 82 . . . substrate
3, 23, 43, 63, 79, 83 . . . sealing resin portion
3a liquid silicone resin
5A, 5B, 25A, 65A-65D, 75A-75D . . . interconnect pattern
6, 26, 46, 66-68, 86 . . . LED chip
7, 27, 47, 76A, 76B, 77A, 77B . . . bonding wire
8A, 8B . . . external connection electrode
31, 32, 51, 52 . . . external connection terminal
9A, 9B . . . through conductive layer
10, 30, 35, 55, 70, 78, 90, 94 . . . primer
11 . . . dam sheet
12 . . . metal mold
22, 42 . . . resin portion
22A, 42A . . . base portion
22B, 42B . . . wall portion
25, 45 . . . lead frame
25A, 45A . . . first portion
25B, 45B . . . second portion 33, 44, 73 . . . metal reflection coating
81 . . . light emitting unit
93 . . . reflector member
93A . . . reflecting surface

The invention claimed is:
1. A light emitting device comprising:
a substrate;
a metal portion formed on a surface of the substrate;
an LED chip supported by the substrate;
a sealing resin portion which covers the LED chip; and
a primer made of resin and provided between the metal portion and the sealing resin portion and contacting both the metal portion and the sealing resin portion,
wherein at least a top surface of the LED chip is exposed on the outside of the primer and wherein the primer does not exist between the substrate and the LED chip;
a wall portion protruding from the substrate;
a metal reflecting film formed on an inner wall surface of the wall portion;
wherein the metal reflecting film is covered with the sealing resin portion, and
wherein the primer is provided between the metal reflecting film and the sealing resin portion, and
wherein the primer contacts both the metal reflecting film and the sealing resin portion.

* * * * *